United States Patent
Barr et al.

(10) Patent No.: US 6,843,660 B2
(45) Date of Patent: Jan. 18, 2005

(54) CABLE SYSTEMS AND RELATED METHODS

(75) Inventors: Andrew Harvey Barr, Roseville, CA (US); Jeremy Ian Wilson, Roseville, CA (US); Irving McKenzie Birmingham, Rocklin, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/719,937

(22) Filed: Nov. 21, 2003

(65) Prior Publication Data

US 2004/0106321 A1 Jun. 3, 2004

Related U.S. Application Data

(62) Division of application No. 10/298,876, filed on Nov. 18, 2002, now abandoned.

(51) Int. Cl.[7] .............................................. H01R 12/00
(52) U.S. Cl. .................................................... 439/67
(58) Field of Search .............................. 439/494–495, 439/66–67; 174/36, 117 F, 117 FF

(56) References Cited

U.S. PATENT DOCUMENTS

| 3,612,743 A | 10/1971 | Angele et al. |
| 3,612,744 A | 10/1971 | Thomas |
| 5,105,055 A | 4/1992 | Mooney et al. |
| 5,158,820 A | 10/1992 | Scammell |
| 5,928,228 A | 7/1999 | Kordis et al. |
| 6,045,396 A | 4/2000 | Tighe |
| 6,241,532 B1 | 6/2001 | Howell |
| 2001/0019919 A1 * | 9/2001 | Mochizuki et al. ......... 439/494 |
| 2002/0081878 A1 | 6/2002 | Bruno |

FOREIGN PATENT DOCUMENTS

| DE | 3417400 A1 | 11/1985 |
| GB | 1 468 862 | 3/1977 |
| GB | 2047947 A | 12/1980 |
| JP | 62103906 | 5/1987 |

* cited by examiner

Primary Examiner—J. F. Duverne

(57) ABSTRACT

An embodiment of a cable system includes a cable that has a conductor, a power layer and dielectric material. The conductor is operative to carry a signal, the dielectric material is located at least partially between the conductor and the power layer, and the power layer is operative as ground. The power layer is formed of a conductive material and includes a first region and an adjacent second region. The first region includes a greater amount of the conductive material than the second region so that the power layer is less resistant to bending along the second region than along the first region. Methods and other systems are also provided.

12 Claims, 4 Drawing Sheets

CABLE SYSTEMS AND RELATED METHODS

CROSS REFERENCE TO RELATED APPLICATIONS

This application is a divisional application, which is based on and claims priority to U.S. Utility Patent Application entitled, "Cable Systems and Related Methods," Ser. No. 10/298,876, filed on Nov. 18, 2002 now abandoned, and which is incorporated herein in its entirety.

BACKGROUND

A flex cable is an impedance-controlled cable that is used to connect two components, such as printed circuit boards (PCBs), that are oriented in such a manner that directly connecting the components to each other is impractical. As the name implies, a flex cable is flexible and, thus, can be twisted and/or bent to accommodate interconnection of the components. Care must be taken, however, to ensure that such a flex cable is not bent beyond a minimum bend radius.

A typical flex cable is constructed of multiple layers of material, including a signal layer, a dielectric layer, and a power layer. The signal layer typically is formed of conductors, e.g., copper conductors, that are positioned in a generally planar arrangement, with each of the conductors being capable of carrying a separate signal. One or more dielectric layers surround the signal layer so that the conductors are spaced from the power layer, which functions as ground. Typically, the power layer is a thin plate of material, such as copper.

As the amount of material used in the signal and/or power layers of a flex cable increases, the resistance of the flex cable to bending and/or twisting also typically increases. This can be problematic, particularly when an increased amount of material is required to provide an appropriate number of conductors while attempting to provide enough flexibility for the intended application.

SUMMARY

An embodiment of a cable system includes a cable that has a conductor, a power layer and dielectric material. The conductor is operative to carry a signal, the dielectric material is located at least partially between the conductor and the power layer, and the power layer is operative as ground. The power layer is formed of a conductive material and includes a first region and an adjacent second region. The first region includes a greater amount of the conductive material than the second region so that the power layer is less resistant to bending along the second region than along the first region.

Another embodiment of a cable system includes a cable. The cable incorporates a power layer that is operative as ground. The power layer is formed of a conductive material and includes multiple first locations and multiple second locations. Each of the first locations includes an amount of conductive material greater than the second locations so that the power layer is more resistant to bending at the first locations than at the second locations.

Another embodiment of a cable system includes a flex cable having means for enabling the flex cable to bend preferentially along an axial-bending region, the axial-bending region being offset with respect to a longitudinal axis of the flex cable.

An embodiment of a method for forming a cable systems comprises providing a power layer including at least a first region of reduced material content and forming a flex cable with the power layer.

An embodiment of a method for electrically interconnecting components comprises providing a flex cable having a power layer that includes at least a first region of reduced material content, providing a first component and a second component that are to be electrically interconnected to each other, and electrically interconnecting the first component and the second component with the flex cable.

DETAILED DESCRIPTION

Figure 1:
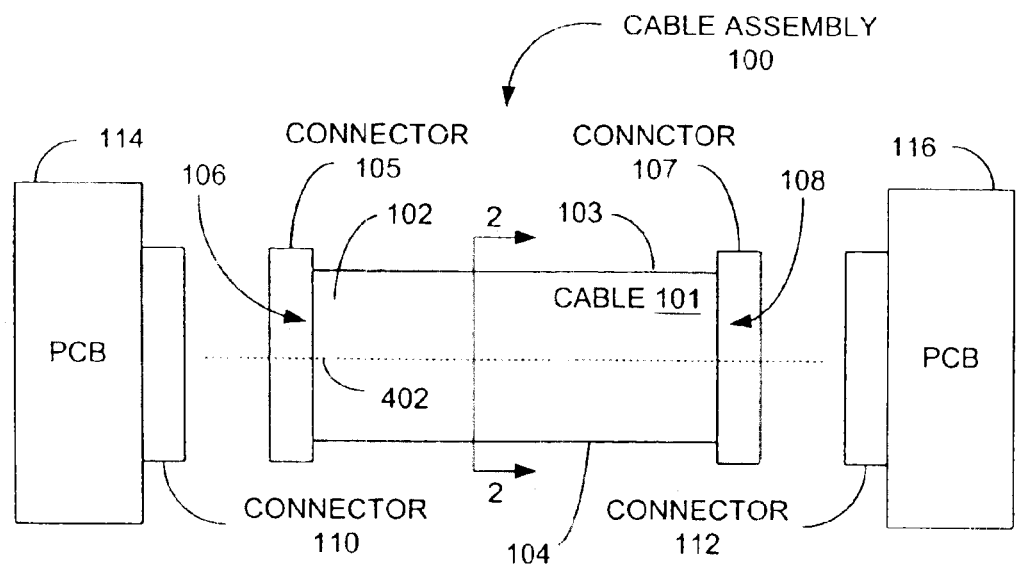
FIG. 1 is a schematic, plan view of an embodiment of a cable system.

As shown in FIG. 1, an embodiment of a cable system 10 includes a cable assembly 100. The cable assembly 100 includes a cable 101, upper surface 102 and side surfaces 103, 104 of which are shown. The constituent components of the embodiment of the cable assembly of FIG. 1 will be described with respect to FIG. 2.

Cable 101 is coupled to a connector at each of its ends. In particular, connector 105 is coupled to end 106, and connector 107 is coupled to end 108. Note, connectors 105 and 107 can be selected from among various types of connectors. By way of example, and not limitation, FC, SCSI and SATA connectors can be used.

Each of the connectors 105, 107 is sized and shaped to mate with a corresponding connector 110, 112 of a respective component 114, 116. In FIG. 1, components 114 and 116 are each configured as a printed circuit board (PCB). However, components of various other types can be used. Specifically, the components need only be configured to communicate with each other, such as via cable assembly 100.

Figure 2:
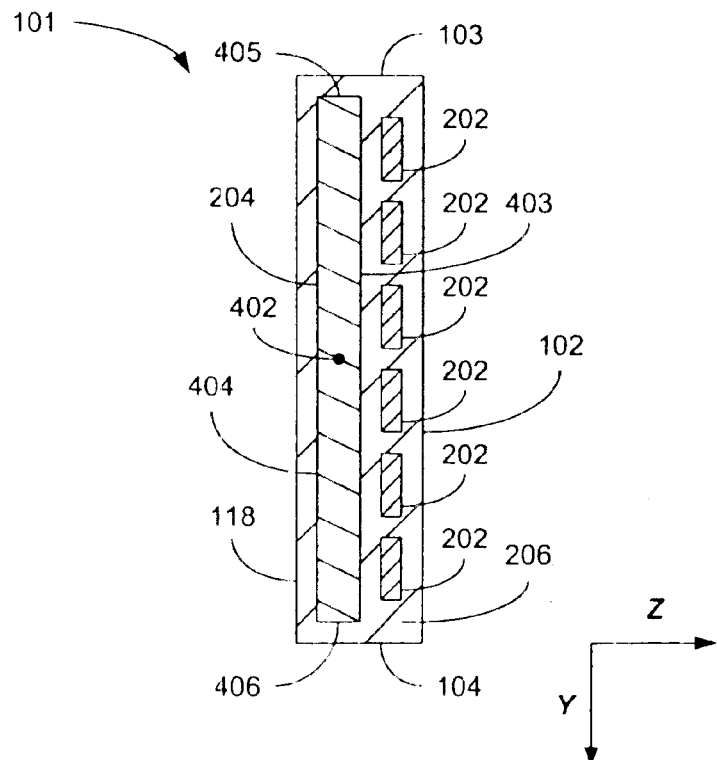
FIG. 2 is a schematic diagram of the embodiment of the cable system of FIG. 1, as viewed along section line 2—2.

In FIG. 2, the sides, i.e., upper surface 102, bottom surface 118 and side surfaces 103 and 104, of the cable 101 are shown. Also shown in FIG. 2, cable 101 includes multiple conductors 202 that span the length of the cable, and which communicate with the connectors (105, 107). Typically, each of the conductors 202 is spaced from other conductors, as well as from the power layer 204. Note, power layer 204 typically functions as ground. The interstices formed between the various conductors 202 and the power layer 204 may be filled by dielectric material 206, which can also form a protective exterior coating that surrounds the conductors 202 and power layer 204. Note, various numbers and configurations of conductors, power layers and dielectric material can be used.

Figure 3:
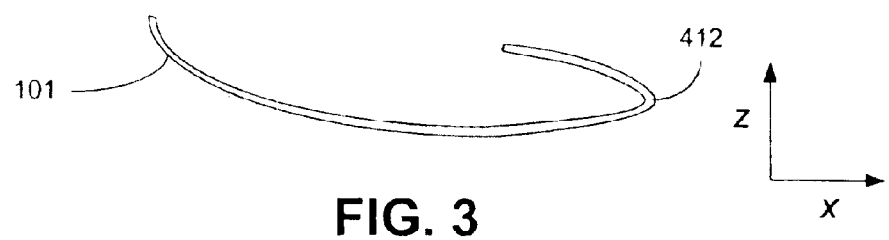
FIG. 3 is a schematic diagram of the embodiment of the cable system of FIGS. 1–2, showing the cable being bent from the x-y plane.

FIG. 3 is a schematic diagram that depicts a representative portion of cable 101 of FIG. 1. As shown in FIG. 3, cable 101 bends preferentially from the xy plane. Note that cable 101 is bent at location 412 at a bend radius that is smaller than the minimum bend radius of a conventional flex cable. Thus, not only does the embodiment of FIGS. 1–3 bend preferentially at location 412, the bending may be to a degree that is not achievable in conventional flex cables. The structural characteristics that enable this preferential bending will now be described with respect to FIG. 4.

Figure 4:
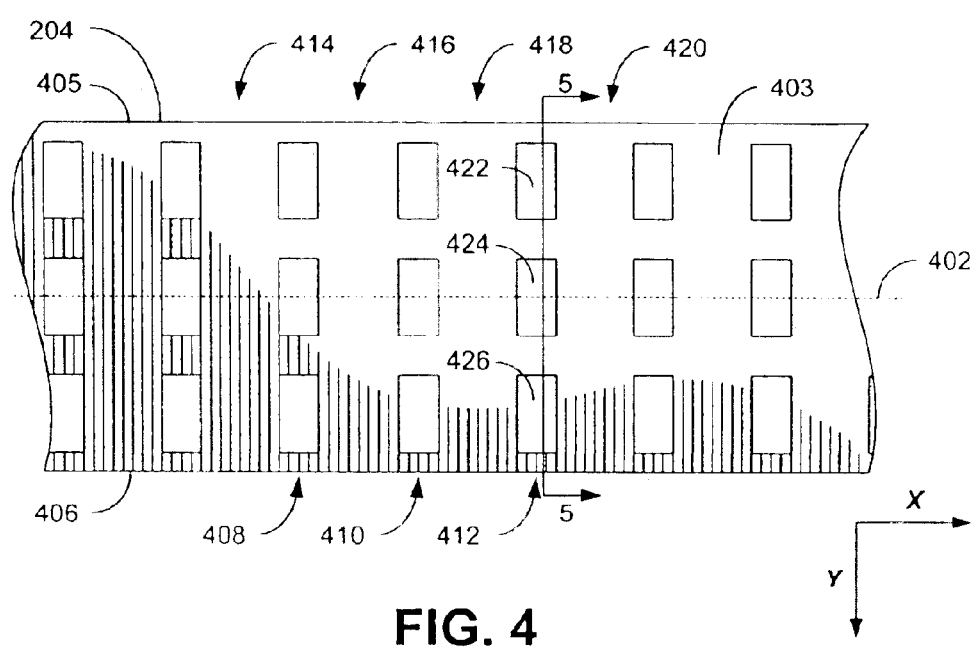
FIG. 4 is a schematic diagram of the embodiment of the cable system of FIGS. 1–3, showing detail of the power layer.

A representative portion of cable 101 and, in particular, power layer 204 (FIG. 2), is shown in FIG. 4. Power layer 204 is formed of a conductive material, such as copper. Power layer 204 has a longitudinal axis 402, a top surface 403, a bottom surface 404 (FIG. 5), and side surfaces 405, 406. Power layer 204 also has axial-bending regions, e.g., axial-bending regions 408, 410 and 412, that are transverse to longitudinal axis 402. The axial-bending regions 408, 410 and 412 contain less material than regions 414, 416, 418 and 420, which are located adjacent to the axial-bending regions. Because of the disparity in the amount and location of material forming the power layer, the cable tends to bend about the axial-bending regions in response to a bending force. In other words, regions 414, 416, 418 and 420, each of which also extends generally transverse to longitudinal axis 402, resists bending to a greater extent than the axial-bending regions.

Note that the axial-bending regions of a power layer can be provided in various manners. By way of example, the lack of material associated with an axial-bending region 412 are formed by voids 422, 424 and 426.

Figure 5:
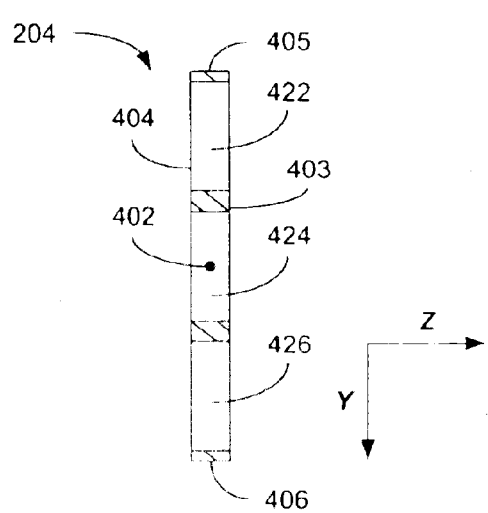
FIG. 5 is a schematic diagram of the embodiment of the power layer of FIG. 4, as viewed along section line 5—5.

As shown in FIG. 5, voids 422, 424 and 426 extend through the power layer 204 from the top surface 403 of the power layer 204 to the bottom surface 404 of the power layer 204. Note, although the three voids 422, 424 and 426 are depicted in FIG. 5 as being substantially uniform with respect to size and shape, various sizes, shapes and/or numbers of voids can be used in a power layer. For example, sizes and/or shapes that lack uniformity can be used.

Figure 6:
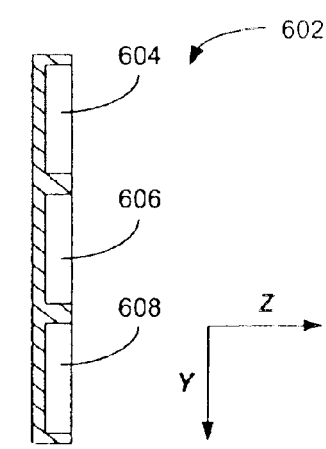
FIG. 6 is a schematic diagram of another embodiment of a power layer as viewed in cross-section.

In contrast, other embodiments can include one or more recesses, i.e., locations where the material of the power layer is thinner than the material of adjacent locations. FIG. 6 schematically depicts a cross-sectional view of an embodiment of a power layer that includes recesses.

As shown in FIG. 6, power layer 602 includes recesses 604, 606 and 608. Note, although the recesses are depicted in FIG. 6 as being substantially uniform in size and shape, various configurations of recesses can be used. Also note that, in some embodiments, combinations of recesses and voids can be used to form an axial-bending region.

Figure 7:
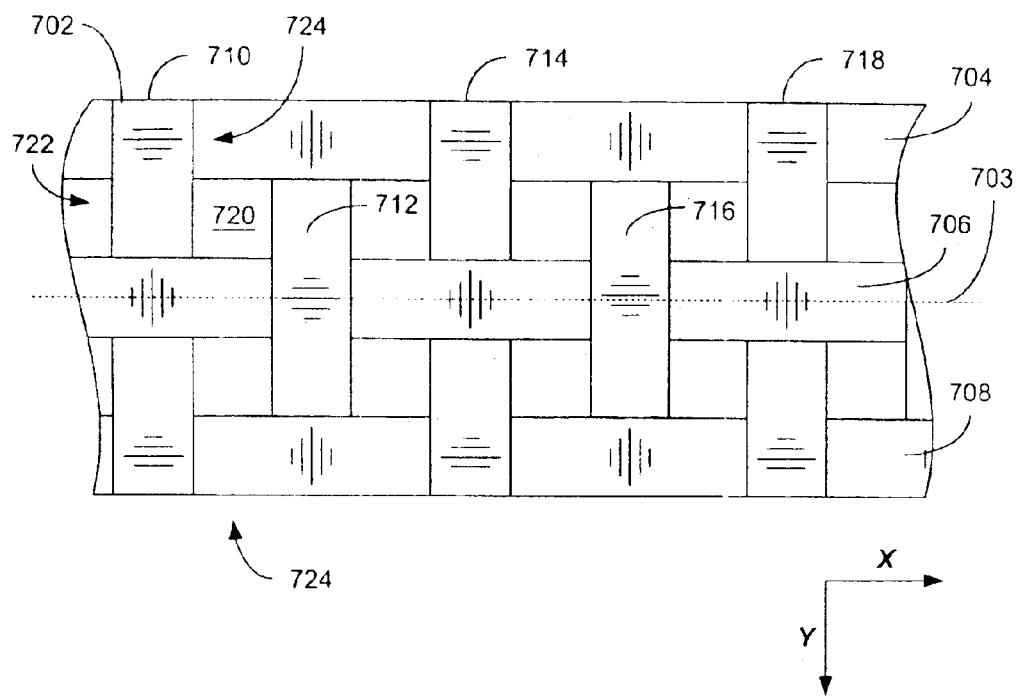
FIG. 7 is a schematic diagram of another embodiment of a power layer.

Another embodiment of a power layer that can be used in a cable system is depicted schematically in FIG. 7. As shown in FIG. 7, power layer 702 has a longitudinal axis 703 and is formed of multiple strips of material. In particular, the power layer 702 is formed of multiple strips of material that are interwoven to form regions that include greater amounts of material than adjacent regions. Specifically, the power layer 702 includes generally longitudinally-extending strips, e.g., strips 704, 706 and 708 and generally transversely-extending strips, e.g., strips 710, 712, 714, 716 and 718. These interwoven strips of material are spaced from each other to form voids, e.g., void 720. Such a void includes less material than a location at which only a single strip of material is located, such as region 722, and much less material than included in region 724, which includes an overlapping portion of strips 706 and 712. The voids form axial-bending regions, e.g., axial-bending region 724, about which the power layer 702 bends preferentially.

Note that various numbers and shapes of strips can be used to form a power layer. Additionally, in some embodiments, at least some of the strips may not be spaced from each other to form voids.

Figure 8:
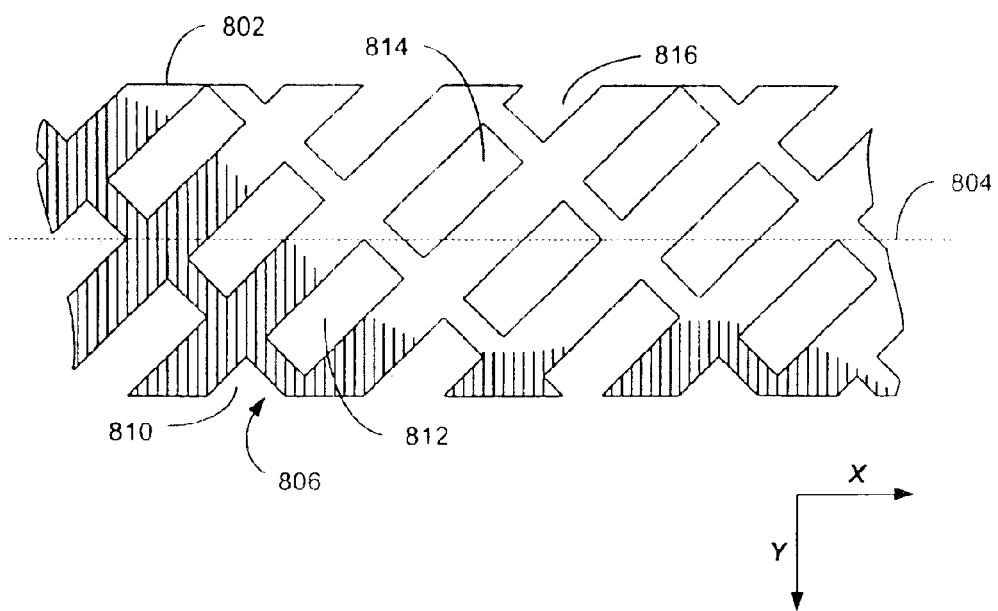
FIG. 8 is a schematic diagram of another embodiment of a power layer.

Another embodiment of a power layer is depicted schematically in FIG. 8. As shown in FIG. 8, power layer 802 includes a longitudinal axis 804 and axial-bending regions, e.g., axial-bending region 806. Each of the axial-bending regions is angularly offset with respect to the longitudinal axis 804. Specifically, axial-bending region 806 is formed by a row 808 of voids. Row 808 extends diagonally across the power layer 802 and includes voids 810, 812, 814 and 816. Note, each of the rows of voids defines an independent axial-bending axis, such that the power layer can be bent about each of the rows.

Figure 9:
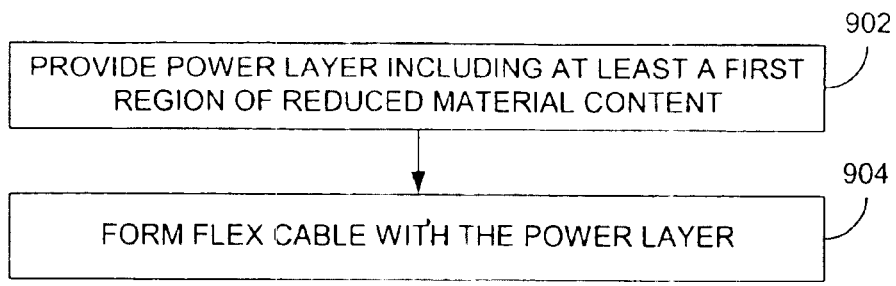
FIG. 9 is a schematic diagram depicting two representative components that are electrically interconnected using an embodiment of a cable system.

An embodiment of a method for forming a cable system is depicted in FIG. 9. As shown in FIG. 9, the method may be construed as beginning at block 902, where a power layer that includes at least a first region of reduced material content is provided. In block 904, a flex cable is formed with the power layer.

Figure 10:
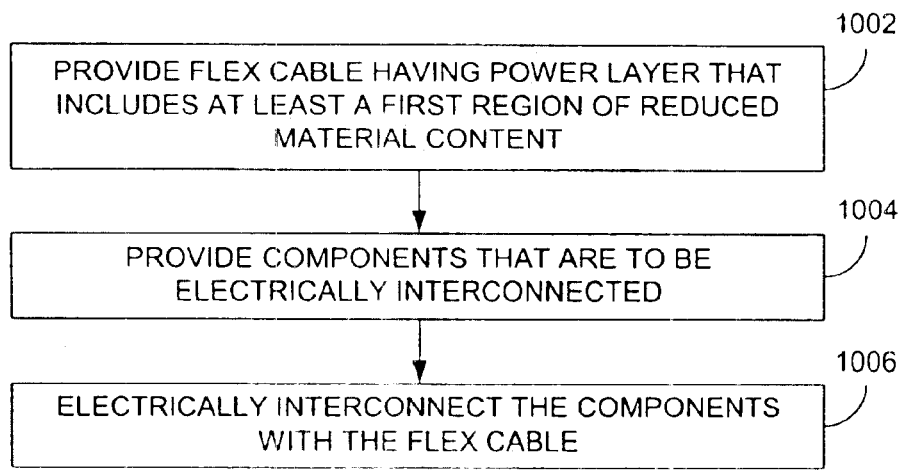
FIG. 10 is a flowchart depicting an embodiment of a method for forming a cable system.

An embodiment of a method for interconnecting components is depicted in the flowchart of FIG. 10. As shown in FIG. 10, the method maybe construed as beginning at block 1002, where a flex cable having a power layer that includes at least a first region of reduced material content is provided. In block 1004, components that are to be electrically interconnected are provided. Thereafter, the components are electrically interconnected with the flex cable (block 1006).

Figure 11:
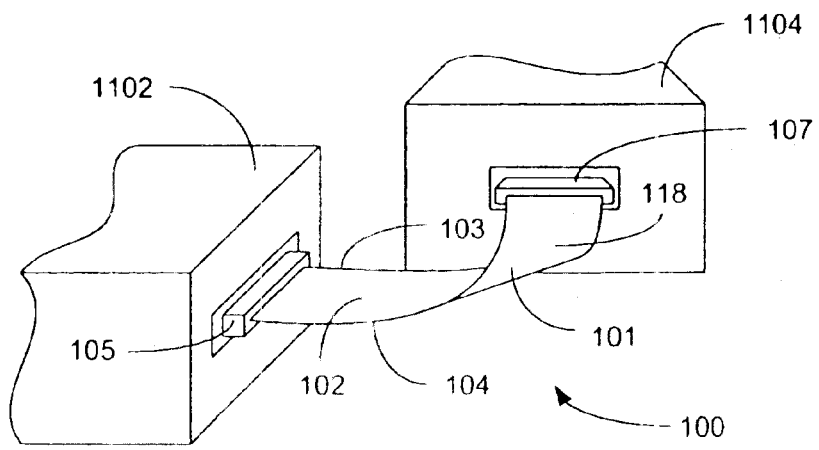
FIG. 11 is a flowchart depicting an embodiment of a method for electrically interconnecting components.

FIG. 11 schematically depicts components that are electrically interconnected by an embodiment of a cable system. In particular, component 1102 electrically communicates with component 104 via an embodiment of a cable assembly 100. The embodiment of the cable assembly 100 of FIG. 11 includes an embodiment of a power layer (not shown in FIG. 11) similar to the power layer 802 of FIG. 8. In particular, the power layer of the cable system 100 of FIG. 11 includes axial-bending regions that are angularly offset with respect to the longitudinal axis of the cable. As such, the cable 101 is able to bend at the angle depicted. Specifically, cable 101 extends outwardly from component 1102 and turns approximately 90 degrees so that it can connect to component 1104.

It should be emphasized that the above-described embodiments are merely possible examples of implementations. Many variations and modifications may be made to the above-described embodiments. All such modifications and variations are intended to be included herein within the scope of this disclosure and protected by the following claims.

What is claimed is:
1. A cable system comprising:
 a cable having a conductor, a power layer and dielectric material, the conductor and power layer being embedded in and surrounded by the dielectric material, the dielectric material being located at least partially between the conductor and the power layer, the con- ductor being operative to carry a signal, the power layer being operative as ground, the power layer being formed of a conductive material and having a first region and an adjacent second region, the first region including a greater amount of the conductive material than the second region such that the power layer is less resistant to bending along the second region than along the first region;

the cable has a longitudinal axis; and the second region defines an axial bending region about which the power layer is less resistant to bending, the axial-bending region being angularly displaced with respect to the longitudinal axis of the cable;

wherein the second region includes a recess defining an area of reduced thickness of the power layer.

2. The cable system of claim 1, wherein the second region includes a void that lacks the conductive material.

3. The cable system of claim 1, wherein the conductor has a first end and a second end; and further comprising:

a first connector electrically communicating with the first end of the conductor; and a second connector electrically communicating with the second end of the conductor.

4. A cable system comprising:

a cable having a conductor, a power layer and dielectric material, the conductor and power layer being embedded in and surrounded by the dielectric material, the dielectric material being located at least partially between the conductor and the power layer, the conductor being operative to carry a signal, the power layer being operative as ground, the power layer being formed of a conductive material and having a first region and an adjacent second region, the first region including a greater amount of the conductive material than the second region such that the power layer is less resistant to bending along the second region than along the first region;

the cable has a longitudinal axis; and the second region defines an axial bending region about which the power layer is less resistant to bending, the axial-bending region being angularly displaced with respect to the longitudinal axis of the cable;

wherein the power layer is formed of interwoven strips of the conductive material.

5. The cable system of claim 4, wherein:

the power layer includes a first strip and a second strip of the conductive material; and the first region is defined at a location where the first strip and the second strip overlap each other.

6. A cable system comprising:

a cable having a power layer operative as ground, the power layer being formed of a conductive material and including multiple first locations and multiple second locations, each of the first locations including an amount of conductive material greater than an amount of conductive material included in the each of the second locations such that the power layer is more resistant to bending at the first locations than at the second locations;

wherein the power layer is formed of interwoven strips of the conductive material.

7. The cable system of claim 6, wherein:

the cable has a first region including multiple ones of the first locations and a second region including multiple ones of the second locations; and the power layer is more resistant to bending along the first region than along the second region.

8. The cable system of claim 7, wherein at least one of the second locations of the second region is a void that lacks conductive material.

9. The cable system of claim 8, wherein:

the cable has a longitudinal axis; and the second region defines an axial-bending region about which the power layer is configured to bend, the axial-bending region being angularly displaced with respect to the longitudinal axis of the cable.

10. The cable system of claim 6, further comprising:

a conductor, spaced from the power layer and operative to propagate a signal.

11. The cable system of claim 6, wherein the power layer is generally planar.

12. A method for electrically interconnecting components comprising:

providing a flex cable having a power layer formed of interwoven strips of conductive material;

providing a first component and a second component that are to be electrically interconnected to each other; and electrically interconnecting the first component and the second component with the flex cable.

* * * * *

UNITED STATES PATENT AND TRADEMARK OFFICE
CERTIFICATE OF CORRECTION

PATENT NO. : 6,843,660 B2
APPLICATION NO. : 10/719937
DATED : January 18, 2005
INVENTOR(S) : Andrew Harvey Barr et al.

It is certified that error appears in the above-identified patent and that said Letters Patent is hereby corrected as shown below:

In column 4, line 44, delete "104" and insert -- 1104 --, therefor.

Signed and Sealed this

Eighth Day of September, 2009

David J. Kappos
*Director of the United States Patent and Trademark Office*